United States Patent [19]
Sakumoto et al.

[11] Patent Number: 5,239,191
[45] Date of Patent: Aug. 24, 1993

[54] SEMICONDUCTOR WAFER

[75] Inventors: Aiichiro Sakumoto, Chigasaki; Michihiro Kawakami, Yokohama, both of Japan

[73] Assignee: Kabushiki Kaisha Toshiba, Kawasaki, Japan

[21] Appl. No.: 888,423

[22] Filed: May 27, 1992

Related U.S. Application Data

[63] Continuation of Ser. No. 642,847, Jan. 18, 1991, abandoned.

[30] Foreign Application Priority Data

Jan. 19, 1990 [JP] Japan ................................ 2-9582

[51] Int. Cl.$^5$ .......................... H01L 29/40; G01R 1/00
[52] U.S. Cl. .................................. 257/203; 324/158 R; 437/8
[58] Field of Search .............................. 357/68, 80, 65; 165/437; 257/203; 324/158 R; 437/8

[56] References Cited

U.S. PATENT DOCUMENTS

| | | | |
|---|---|---|---|
| 3,849,872 | 11/1974 | Hubacher | 29/574 |
| 4,721,995 | 1/1988 | Tanizawa | 357/75 |
| 5,003,374 | 3/1991 | Vokoun, III | 357/68 |
| 5,008,614 | 4/1991 | Shreeve et al. | 357/70 |
| 5,032,889 | 7/1991 | Murao et al. | 357/68 |
| 5,047,711 | 9/1991 | Smith et al. | 357/45 |

FOREIGN PATENT DOCUMENTS 61-190950 8/1986 Japan.
62-265731 11/1987 Japan.
63-120434 5/1988 Japan. *

OTHER PUBLICATIONS

"TAB tape structure for area array tape", IBM TDB, vol. 32, No. 2, Jul. 1989, pp. 305-306.
Shultis, "Semiconductor Wafer Testing," IBM Technical Disclosure Bulletin, vol. 13, No. 7, Dec., 1970.
Bove et al., "Impedance Terminator for AC Testing Monolithic Chips," IBM Technical Disclosure Bulletin, vol. 15, No. 9, Feb., 1973.

*Primary Examiner*—Eugene R. LaRoche
*Assistant Examiner*—Viet Q. Nguyen
*Attorney, Agent, or Firm*—Finnegan, Henderson, Farabow, Garrett & Dunner

[57] ABSTRACT

Upon the making of a die-sort testing for a predetermined IC pattern formed on each chip area, a plurality of sets of output pads selectively supplied with output signals are formed on the chip area and connected with a connection pattern on a dicing line area, and one testing pad is provided for the respective set of the pads. The IC patterns are tested by electrically contacting the testing pad with corresponding probe needle of probe card in a die-sort machine.

6 Claims, 2 Drawing Sheets

SEMICONDUCTOR WAFER

This application is a continuation of application Ser. No. 07/642,847 filed Jan. 18, 1991, now abandoned.

BACKGROUND OF THE INVENTION

1. Field of the Invention

The present invention relates to a semiconductor wafer and, in particular, a semiconductor wafer having an IC (integrated circuit) pattern formed therein.

2. Description of the Related Art

FIG. 1 shows a portion of a conventional semiconductor wafer having an IC pattern formed therein. In FIG. 1, reference number 31 shows a dicing line area; reference number 32 shows a plurality of chip areas into which a wafer is divided by the dicing line area 31; and reference number 33 shows a plurality of pads formed over the respective chip area 32.

During the manufacture of a semiconductor integrated circuit, die-sort testing has been done with the measuring terminals (probe needles) of a die-sort machine's probe card, not shown, placed in contact with corresponding pads 33 on the chip areas 32 to examine the function of the IC chips on the semiconductor wafer.

If the chip areas 32, have a large number of output pads 33 formed thereon, the same number of measuring terminals are required on the probe card of the die-sort machine for use in the die-sort test. That is, many measuring terminals are for a large number of pads 33. For this reason, it becomes very difficult to produce a corresponding probe card. Further, the number of relay switches is remarkably increased in the die-sort machine, requiring a very complex, expensive die sort machine.

With a recent technological progress, a higher packing density IC pattern and smaller IC chip size have been seen as a recent trend. For a semiconductor circuit chip having a larger number of pads, the pad size and pitch become smaller and smaller. For this reason, the probe needles on the die-sort machine's probe card become correspondingly miniaturized and difficulty is encountered in placing the probe needles in contact with the corresponding pads. It takes a longer time to perform such an operation and hence to perform die-sort testing.

SUMMARY OF THE INVENTION

An object of the present invention is to provide a semiconductor wafer which allows an easier die-sort testing to be done even for semiconductor circuit chips having a larger number of pads and which can utilize a less complicated die-sort machine at a lower less equipment cost.

Another object of the present invention is to provide a semiconductor wafer which allows a latitude to be given to the pad size and pad pitch of a semiconductor circuit chip.

Another object of the present invention is to provide a semiconductor wafer which ensures a readiness with which measuring terminals on a die-sort machine's probe card are placed in contact with the corresponding pads for die-sort testing.

Another object of the present invention is to provide a semiconductor wafer which can shorten the time required for die-sort testing.

The objects and advantages of the present invention can be achieved by the semiconductor wafer as will be set out below.

According to the present invention, there is provided a semiconductor wafer including a plurality of chip areas into which it is divided by a dicing line area, as a plurality of chips which each have a predetermined integrated circuit pattern, at least one of the plurality of chip areas having a plurality of sets of pads on the surface of which is selectively supplied with corresponding output signals from the output switching control circuit included in the chip, comprising:

a connection pattern respectively formed on the dicing line area and commonly connecting together the pads in the respective set which extend from the pads in the respective set onto the dicing line area, the pads in the respective set being selectively supplied with the corresponding output signals; and testing pad respectively formed on the dicing line area and respectively connected to the corresponding connection pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

One embodiment of the present invention will be explained below with reference to the accompanying drawings.

Figure 1:
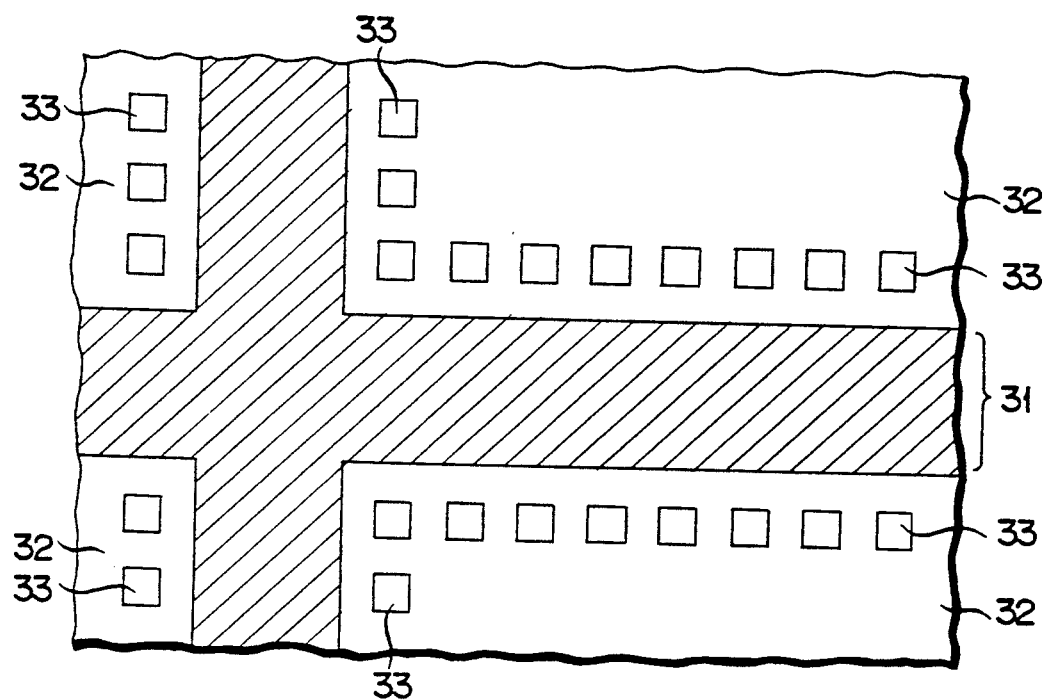
FIG. 1 is a pattern diagram showing a portion of a conventional semiconductor wafer.
Figure 2:
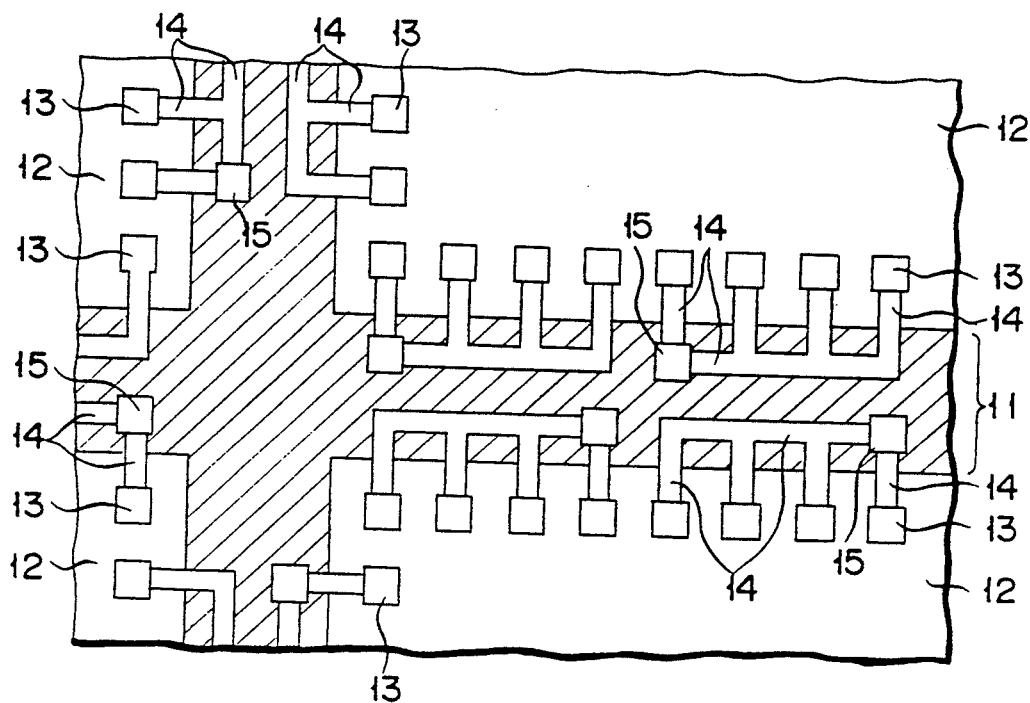
FIG. 2 is a pattern diagram showing a portion of a semiconductor wafer according to an embodiment of the present invention.

FIG. 2 shows a portion of a semiconductor wafer with an integrated circuit pattern formed therein. In the semiconductor wafer, reference number 11 shows a dicing line area; reference number 12 shows chip areas into which the semiconductor wafer is divided by the dicing line area 11; and reference number 13 shows pads (for example, output pads) formed on the respective chip areas 12. Here, on at least one of the chip areas 12, a predetermined IC pattern is formed having an output switching control circuit for selectively supplying output signals to corresponding output pads. Those output pads selectively supplied with output signals are commonly connected by the connection pattern 14. The connection pattern 14 is formed primarily on the dicing line area 11 and extends from the dicing line area 11 onto the respective output pads 13. A testing pad 15 is provided, which is electrically connected to the connection pattern 14 on the dicing line area 11.

For a predetermined IC pattern formed on the chip area 12 on the semiconductor wafer, a die-sort test measures the chip by placing the die-sort machine probe card's probe needle tip in contact with the testing pad 15. That is, with the probe needle connected to the testing pad 15, the output thereof is sequentially and selectively supplied by the switching circuit to the respective output pads in the respective set and the output is transmitted from the testing pad 15 to the probe needle via the connection pattern 14. Since one testing pad 15 is connected to the plurality of pads 13, it can be used as a common testing pad and can be made larger in size than the pad 13 in the chip area 12. Further, as the connection patterns and testing pads are formed on the dicing line area, the pad size and pad pitch of the testing pads 15 on the dicing line area 11 can be set a large as possible, so long as the width of the dicing line area permits.

It is, therefore, possible to achieve the readiness with which the measuring terminal of the die-sort machine's probe card is placed in contact with the testing pad and to enhance the yield of the die sort test. Further, it is not necessary to switch testing contacts by relay switches, thereby not causing mechanical chattering at the contacts. Since no chattering delay time is given to a test program, time required can be shortened. In the embodiment shown, one testing pad 15 is provided for one set of four pads 13 and the test is conducted with the measuring terminal of the probe card contacted with the testing pad. It is only necessary to provide the same number of measuring terminals as that of the testing pads 15, that is, to provide the number of measuring terminals one-fourth in number of that of the pads. It is thus possible to decrease the number of measuring terminals on the probe card and to readily produce such a probe card.

Further, even in the case where the pads 13 are provided the chip area in greater number and/or in a high density, a conventional die-sort machine can be used as it is, allowing the use of less complex die-sort machine at less a lower equipment cost.

Figure 3:
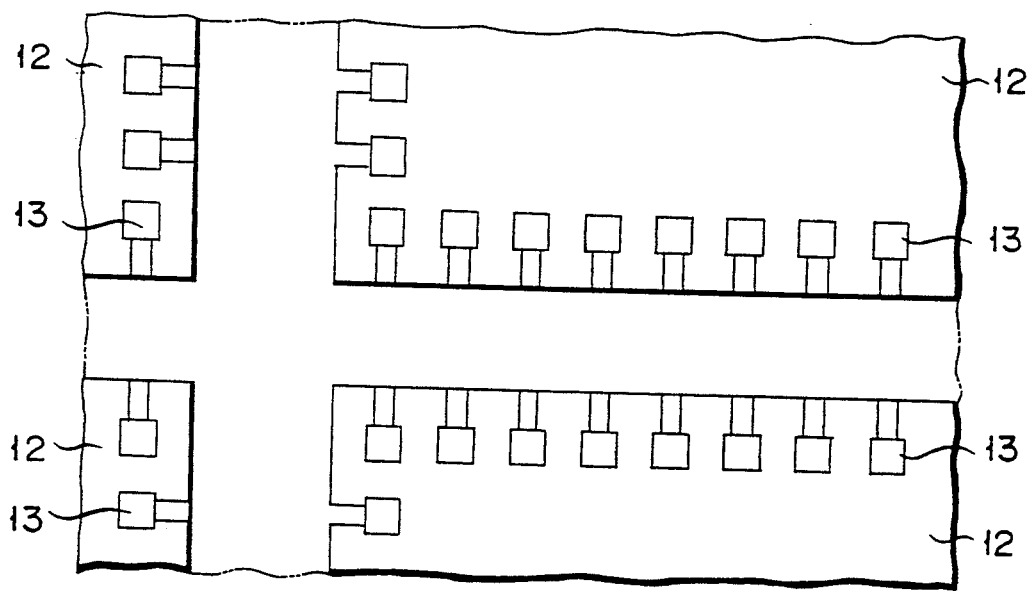
FIG. 3 is a pattern diagram showing a state in which the semiconductor wafer shown in FIG. 2 is divided by a dicing line area into individual integrated circuit chip areas.

FIG. 3 is a pattern diagram partially showing individual chip areas which are divided by a dicing line area after it is subjected to die-sort testing. Since connection pattern 14 and testing pad 15 on the dicing line area are all removed, no inconvenience is encountered when the individual IC chips are produced as products.

Although, in the aforementioned embodiment, one testing pad has been explained as being used for four pads, it can be employed for fewer than or for more than four pads.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor wafer comprising:
   a plurality of chip areas which are divided by a dicing line area, the plurality of chip areas each having a plurality of bonding pads provided therein;
   a plurality of connection patterns formed on the dicing line area, each of the plurality of connection patterns connecting the plurality of bonding pads of a corresponding chip area; and
   a plurality of testing pads, having a predetermined pitch and width, entirely formed on the dicing line area and each respectively connected to a corresponding one of the plurality of connection patterns, the plurality of connection patterns and the plurality of testing pads encompassing substantially the entirety of the dicing line area.

2. The semiconductor wafer as recited in claim 1 further comprising:
   an IC pattern, formed on at least one of the plurality of chip areas, including a switching control circuit for selectively supplying output signals to the plurality of bonding pads on the at least one of the plurality of chip areas.

3. The semiconductor wafer as recited in claim 1, wherein the plurality of testing pads are common testing pads for testing the plurality of bonding pads through the plurality of connection patterns.

4. The semiconductor wafer as recited in claim 1, wherein each of the plurality of testing pads occupies a larger area than each of the plurality of bonding pads.

5. The semiconductor wafer as recited in claim 1, wherein a ratio between the plurality of bonding pads and the plurality of test pads is four to one.

6. A semiconductor wafer comprising:
   a plurality of chip areas which are divided by a dicing line area, the plurality of chip areas each having a plurality of bonding pads provided thereon;
   a plurality of connection patterns formed on the dicing line area, each of the plurality of connection patterns connecting the plurality of bonding pads of a corresponding chip area; and
   a plurality of testing pads, occupying a larger area than each of the plurality of the bonding pads, entirely formed on the dicing line area and each respectively connected to a corresponding one of the plurality of connection patterns, the plurality of connection patterns and the plurality of testing pads encompassing substantially the entirety of the dicing line area.

* * * * *

UNITED STATES PATENT AND TRADEMARK OFFICE
CERTIFICATE OF CORRECTION

PATENT NO. : 5,239,191
DATED : August 24, 1993
INVENTOR(S) : Aiichiro Sakumoto et al.

It is certified that error appears in the above-indentified patent and that said Letters Patent is hereby corrected as shown below:

Claim 1, column 4, line 10, change "therein" to --thereon--.

Signed and Sealed this

Eighth Day of November, 1994

Attest:

BRUCE LEHMAN

*Attesting Officer*     *Commissioner of Patents and Trademarks*